(12) United States Patent
Song et al.

(10) Patent No.: US 8,618,001 B2
(45) Date of Patent: Dec. 31, 2013

(54) LIFTING-OFF METHOD AND METHOD FOR MANUFACTURING TFT ARRAY SUBSTRATE

(75) Inventors: Yongzhi Song, Beijing (CN); Zhaohui Hao, Beijing (CN); Xu Wang, Beijing (CN); Huiyue Luo, Beijing (CN); Guojing Ma, Beijing (CN)

(73) Assignees: Boe Technology Group Co., Ltd., Beijing (CN); Beijing Boe Display Technology Co., Ltd., Beijing (CN)

( * ) Notice: Subject to any disclaimer, the term of this patent is extended or adjusted under 35 U.S.C. 154(b) by 43 days.

(21) Appl. No.: 13/306,086

(22) Filed: Nov. 29, 2011

(65) Prior Publication Data
US 2012/0135570 A1    May 31, 2012

(30) Foreign Application Priority Data

Nov. 30, 2010    (CN) .......................... 2010 1 0574590

(51) Int. Cl.
*H01L 21/461*    (2006.01)

(52) U.S. Cl.
USPC .................... 438/748; 438/149; 257/E21.034

(58) Field of Classification Search
USPC ................. 438/159, 747, 748; 257/E21.023, 257/E21.034, E21.483
See application file for complete search history.

(56) References Cited

U.S. PATENT DOCUMENTS

2004/0048171 A1*  3/2004  Grabher et al. .................. 430/7
2004/0149308 A1   8/2004  Korbler et al.

FOREIGN PATENT DOCUMENTS

| CN | 1732711 A   | 2/2006 |
| CN | 101670556 A | 3/2010 |
| CN | 101840121 A | 9/2010 |
| EP | 1 903 400 A1 | 3/2008 |

OTHER PUBLICATIONS

First Chinese Office Action dated Mar. 22, 2013 Appln. No. 201010574590.0.

* cited by examiner

*Primary Examiner* — Cheung Lee

(74) *Attorney, Agent, or Firm* — Ladas & Parry LLP

(57) ABSTRACT

A lifting-off method and a manufacturing method for a thin film transistor (TFT) array substrate using the same are provided. A lifting-off method comprises forming a cavitation jet flow by using a lifting-off solution, and impacting a to-be-lifted-off surface of a substrate by means of the cavitation jet flow to remove a photoresist and a film deposited on the photoresist over the to-be-lifted-off surface. The disclosure may be applied to manufacturing processes for semiconductor devices or TFT array substrate.

11 Claims, 2 Drawing Sheets

LIFTING-OFF METHOD AND METHOD FOR MANUFACTURING TFT ARRAY SUBSTRATE

BACKGROUND

Embodiments of the present disclosure relates to a lifting-off method and a manufacturing method for a thin film transistor (TFT) array substrate.

The lifting-off method is an important technology used for preparing patterns with a photoresist mask. The lifting-off method is a technology, in which photoresist is peeled off together with the film deposited thereon without tearing or damaging other film patterns on a substrate during removing the photoresist. The lifting-off method is widely used in the microelectronics manufacturing field such as the semiconductor manufacturing field.

By taking a thin film transistor liquid crystal display (TFT-LCD) as an example, which is formed by assembling an array substrate and a color filter substrate with a liquid crystal layer injected therebetween, a lifting-off method is usually used for forming ITO (indium tin oxide) pixel electrodes in manufacturing the array substrate. In detail, a passivation layer is deposited on a glass substrate. After forming a passivation pattern comprising a via hole, photoresist in the non-pixel-electrode areas is remained and an ITO pixel electrode layer is deposited thereon. The remained photoresist is removed through a lifting-off method together with the ITO layer thereon, thereby forming a pixel electrode pattern.

In a conventional lifting-off method, generally the remained photoresist on the substrate is heated first to have the photoresist contract or shrink, whereby the thin film adhered to the photoresist collapses and cracks so that the underneath photoresist is exposed. Next, the exposed photoresist is brought to be in contact with a lifting-off solution by means of spraying the lifting-off solution at a high pressure or immersing the substrate into the lifting-off solution in an ultrasonic treatment. Under the action of the lifting-off solution, the photoresist is removed so that the film attached thereon is also taken off, thus a lifting-off effect is achieved. However, the shrinkage of the photoresist is limited since the amount of the exposed photoresist due to collapse and crack is relatively small, that is, the amount of the photoresist in contact with the lifting-off solution is relatively small, thus the interacting force between the photoresist and the lifting-off solution is not enough, and thereby the process time is relatively long and the lifting-off effect is relatively poor.

SUMMARY

According to an aspect of the disclosure, a lifting-off method comprises forming a cavitation jet flow by using a lifting-off solution; and impacting a to-be-lifted-off surface of a substrate by means of the cavitation jet flow to remove photoresist and a film deposited on the photoresist over the to-be-lifted-off surface.

According to another aspect of the disclosure, a manufacturing method for a TFT array substrate, comprises: depositing a first metal film on a base substrate, and forming a pattern including a gate line and a gate electrode; sequentially depositing a gate insulating layer, an active layer film and a source/drain metal film, and forming a pattern including a data line, a source electrode, a drain electrode and a TFT channel region; depositing a passivation layer; coating a layer of photoresist on the passivation layer, and forming a via hole through the passivation layer by a patterning process, after which the photoresist on a pixel electrode area of the base substrate is completely removed, and the photoresist on an area of the base substrate other than the pixel electrode area and the via hole area is remained; depositing a pixel electrode film; and removing remained photoresist and the pixel electrode film deposited on the remained photoresist by using a lifting-off method, wherein removing of remained photoresist and the pixel electrode film deposited on the remained photoresist by using a lifting-off method is preformed by using the above-described lifting-off method.

Further scope of applicability of the present disclosure will become apparent from the detailed description given hereinafter. However, it should be understood that the detailed description and specific examples, while indicating embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

The embodiment of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

The lifting-off method according to one embodiment of the disclosure comprises the following steps.

Step S11, forming a cavitation jet flow by using a lifting-off solution.

The lifting-off solution used in this step is a chemical solution capable of resolving photoresist. In particular, the lifting-off solution may include an alkali-type lifting-off solution or an organic-type lifting-off solution. For example, the alkali-type lifting-off solution may comprise potassium hydroxide, glycol ether, amine, and deionized water, where the contents in weight percent of the components in the lifting-off solution may be 15.8-17.8% of potassium hydroxide, 14.0-16.0% of glycol ether, and 51.0-55.0% of amine with the remained being deionized water. For example, the organic-type lifting-off solution may comprise polyethylene glycol ether, polyoxyethylene alkyl ether, chelating dispersing agent, antiseptics, electrolyte, and deionized water, where the contents in weight percent of the components in the lifting-off solution may be 5-20% of polyethylene glycol ether, 5-20% of polyoxyethylene alkyl ether, 5-10% of chelating dispersing agent, 1-5% of antiseptics, and 3-15% of electrolyte with the remained being deionized water. However, the amount of each component in the lifting-off solution is not limited thereto. The amounts may be determined according to practical conditions such as the thickness of the photoresist, the thickness of the film deposited thereon, and so on.

Cavitation jet is a cleaning method which transforms liquid into particulates, by ejecting compressed air at a high speed.

A cavitation jet flow is generated by inducing initial bubbles containing air, vapor or mixing gas into water jet flow, and a distance to the target after the water jet flow is ejected is properly controlled so that the bubbles can grow and expand. When the jet flow arrives at to or near the surface of the target, the bubbles collapse or break, which results in cavitation erosions or damages to the target, thereby realizing the effect of cleaning, cutting or breaking up on the target material. Because the energy resulting from breaking bubbles is concentrated and is imparted to a lot of small areas, a huge impact to the area around the bubbles is generated at the moment of the collapsing, and the pressure around the bubbles may be hundreds of atmospheres and the local temperature is high, and a huge energy thus is locally released. This huge pressure can destroy undissolved contaminants and resolve them into the jet flow solutions.

Figure 1:
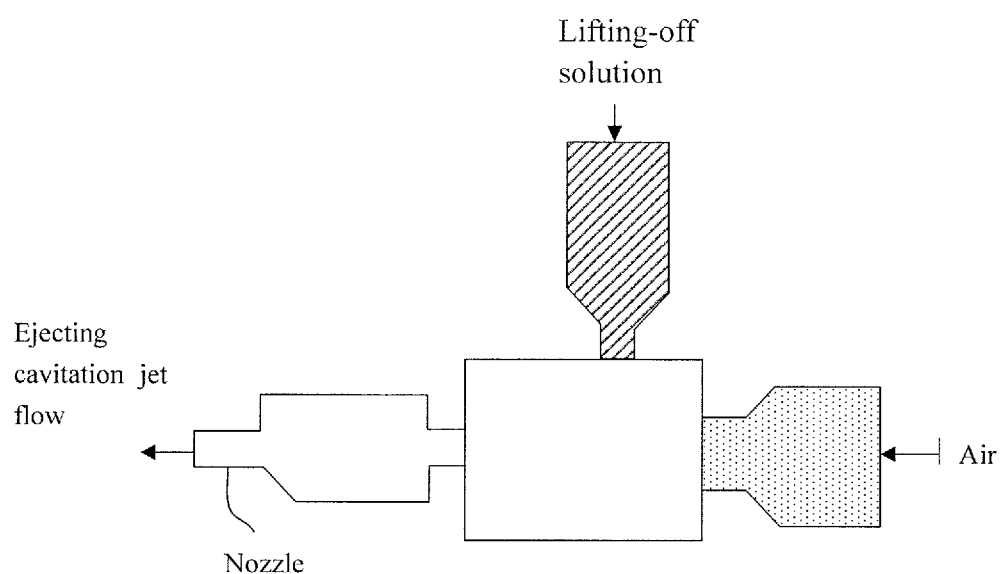
FIG. 1 illustrates a schematic diagram of an apparatus for forming a cavitation jet flow according to an embodiment of the disclosure.

Based on the above discussion, a cavitation jet flow is formed by using the lifting-off solution in the present step. In particular, a cavitation jet flow is generated by mixing the lifting-off solution and an air flow. As shown in FIG. 1, a certain amount of the lifting-off solution is mixed with air within a cavitation jet apparatus to generate a cavitation jet flow to be ejected from the cavitation jet apparatus. There are the following advantages for generating a cavitation jet flow by using a lifting-off solution: on one hand, the photoresist and the film deposited thereon is removed under the effect of the bubble collapse within the cavitation jet flow, that is, by means of physical force action; on the other hand, the photoresist and the film deposited thereon may be additionally removed through the chemical effect of the lifting-off solution for resolving the photoresist.

It is to be noted that, the impact force of the generated cavitation jet flow can be adjusted by changing the flow rates of the lifting-off solution and the air or by changing the ratio of the flow rates thereof, so that the impact force of the cavitation jet flow decreases or gradually decreases. The reason is that, most or all of the photoresist and the film deposited thereon on the to-be-lifted-off surface of the substrate are needed to break or fall off with the cavitation jet flow in the early stage of the lifting-off process. Here, the to-be-lifted-off surface refers to a surface of the substrate that will be subject to a lifting-off process. Next, as the photoresist and the film deposited thereon on have broken or fallen off, the lifting-off solution can easily contact the photoresist, whereby the interaction between the lifting-off solution and the photoresist is enhanced; accordingly, the impact force of the cavitation jet flow in this stage can be less than that of the previous cavitation jet flow.

For example, while a lifting-off process is performed onto a same substrate, the flow rate ratio between the lifting-off solution and the air flow is increased over time. For example, the flow rate of the lifting-off solution is kept constant while the flow rate of the air is decreased, so that on one hand the impact force of the cavitation jet flow is decreased and on the other hand the lifting-off solution is saved so as to reduce the production cost.

In an embodiment of the disclosure, the cavitation jet flows may be generated by a same cavitation jet apparatus. For example, a lifting-off process is performed onto a substrate by means of cavitation jet flows generated by a same cavitation jet apparatus. The flow rate of the lifting-off solution is kept constant and the flow rate of the air is gradually decreased in the cavitation jet apparatus over time so that the impact force of the cavitation jet flow become decreased gradually. However, the scope of the disclosed technology is not limited thereto. For example, different cavitation jet apparatuses may be used to generate cavitation jet flows. The impact forces of the cavitation jet flows generated by different cavitation jet apparatuses may be the same as or different from each other. In this case, the substrate first passes nozzles of a leading cavitation jet apparatus, and then passes nozzles of a following cavitation jet apparatus. Preferably, the substrate passes nozzles of different cavitation jet apparatuses at a constant speed, by which the impact energies of the cavitation jet flows acting on the to-be-lifted-off surface of the substrate may be uniform or almost uniform; accordingly, all portions of the to-be-lifted-off surface of the substrate may be removed at substantially the same time, which ensures the uniformity of the lifting-off and shortens the processing time.

Step S12, impacting the to-be-lifted-off surface of the substrate with the cavitation jet flow to remove the photoresist and the film deposited thereon over the to-be-lifted-off surface.

The to-be-lifted-off surface is a surface of the substrate on which a lifting-off process is to be performed. The photoresist with the film deposited thereon is remained on the to-be-lifted-off surface in the previous process.

In this step, the cavitation jet flow formed by using the lifting-off solution impacts on the to-be-lifted-off surface. The chemical capacity of the lifting-off solution for resolving photoresist and the huge energy released when the bubbles generated in the cavitation jet flow collapse or break at the moment of impacting on the to-be-lifted-off surface can quickly remove the photoresist and the film deposited thereon over the to-be-lifted-off surface. On one hand, the to-be-lifted-off surface is impacted with bubbles generated in the cavitation jet flow, where huge energy is released at the moment when the bubbles collapse and break so that the photoresist and the film deposited thereon break off due to cavitation erosion and thus can be removed. On the other hand, after the photoresist and the film deposited thereon break off due to cavitation erosion, the lifting-off solution acts on the photoresist, so that the photoresist and the film deposited thereon are removed with the chemical capacity of the lifting-off solution for resolving photoresist. Accordingly, the process time is effectively shortened. In addition, as the impacting energy of the cavitation jet flow onto the to-be-lifted-off surface is concentrated and uniform and the concentration of the lifting-off solution is constant, a uniform lifting-off can be ensured and the lifting-off effect is improved.

When the cavitation jet flow is employed to impact onto the to-be-lifted-off surface of the substrate, the impact direction of the cavitation jet flow may be perpendicular to the to-be-lifted-off surface. The impact direction of the cavitation jet flow may also preferably deflect a certain angle from the perpendicular direction. In this way, the impact force of the cavitation jet flow onto the to-be-lifted-off surface of the substrate may be increased and the lifting-off effect is improved.

It is to be noted that, when the to-be-lifted-off surface of the substrate is impacted by the cavitation jet flow, although the impact force of the cavitation jet flow is large, the film on a surface without any photoresist remained will not be affected by the cavitation jet flow. The reason is, by taking the ITO film on a TFT array substrate for example, the ITO film and the lower passivation layer have substantially the same strain, that is, a stress that would cause damages to the ITO film at the interface between the ITO film and the lower film is not likely to occur. Further, the ITO film has a small step difference, and thus is difficult to be broken by the impact of the cavitation jet flow. On the contrary, the photoresist is relatively loose and has a different strain from the ITO film thereon, which facilitates a stress to occur therebetween. In addition, the photoresist has a relatively large thickness and thus a large step difference, the photoresist and the film deposited thereon is likely to be broken or removed by the impact of the cavitation jet flow.

However, the disclosure is not limited thereto. In an embodiment of the disclosure, a shield may be disposed over the substrate, which exposes only the surface portion of the substrate with the photoresist remained thereon and the film attached on the photoresist. The other portions of the substrate are covered and protected from damage.

Next, the lifting-off method according to an embodiment of the disclosure is described. The method comprises the following steps.

Step S21, forming a first cavitation jet flow by using a lifting-off solution.

For example, the first cavitation jet flow is formed with the lifting-off solution and air of certain flow rates in this step. For example, the flow rate of the lifting-off solution may be 30-50 L/min, and the flow rate of the air may be 1650-2200 L/min.

Step S22, impacting the to-be-lifted-off surface of the substrate with the first cavitation jet flow.

The impacting direction of the first cavitation jet flow may be perpendicular to the to-be-lifted-off surface. The impacting direction of the cavitation jet flow may also preferably deflect a certain angle from the perpendicular direction to improve the lifting-off effect.

Immediately after this step, most or all of the photoresist and the film deposited thereon on the to-be-lifted-off surface of the substrate would rupture or fall off under the double action of the lifting-off solution and the cavitation jet flow, which results in an initial lifting-off effect. In order to improve the lifting-off effect, next, the present embodiment comprises the following steps.

Step S23, forming a second cavitation jet flow by using a lifting-off solution.

The initial lifting-off has been performed to the substrate through the foregoing steps. Accordingly, little photoresist and the film on the photoresist remain on the substrate, or the adherence force of the photoresist with the substrate is weaken. In this case, the impact force of the second cavitation jet flow onto the to-be-lifted-off surface should be less than that of the first cavitation jet flow.

For example, the second cavitation jet flow is formed by using the lifting-off solution and an air flow in certain flow rates in this step. For example, the flow rate of the lifting-off solution may be 30-50 L/min, and the flow rate of the air may be 770-1100 L/min. Compared with the first cavitation jet flow, the flow rate of the lifting-off solution is unchanged, but the flow rate of the air is decreased. Accordingly, the impact force of the second cavitation jet flow onto the to-be-lifted-off surface is less than that of the first cavitation jet flow.

It is to be noted that, the first and second cavitation jet flows may be generated by a same cavitation jet apparatus in the present embodiment. For example, the second cavitation jet flow is formed following the forming of the first cavitation jet flow by decreasing the flow rate of the air into the cavitation jet apparatus, which is one way easy to control the air flow rate and have an excellent effect. Those skilled in the art may understand that during the lifting-off process which is performed to remove the photoresist and the film thereon through a same cavitation jet apparatus, the flow rate of the lifting-off solution may be kept constant and the flow rate of the air is decreased gradually. Alternatively, the cavitation jet flow may be generated in a step-down manner as desired. For example, the flow rate of the lifting-off solution and the flow rate of the air may be set to appropriate values according to requirements in practices.

Alternatively, the first and second cavitation jet flows may be respectively formed by first and second cavitation jet apparatuses. In this case, when the cavitation jet flows impact onto the to-be-lifted-off surface of the substrate, the substrate moves in a uniform speed. The substrate first passes nozzles of the first cavitation jet apparatus and is subject to the first cavitation jet flow, and then passes nozzles of the second cavitation jet apparatus and is subject to the second cavitation jet flow. For example, the uniform moving speed of the substrate may be 1000-5000 mm/s.

Step S24, impacting the to-be-lifted-off surface of the substrate with the second cavitation jet flow.

Under the impact of the second cavitation jet flow (that is, the to-be-lifted-off surface of the substrate undergoes the impact of the second cavitation jet flow), the remained photoresist and the film thereon after the impact of the first cavitation jet flow onto the to-be-lifted-off surface may be further removed, and the removing effect is further enhanced.

In addition, after step 22 and before step 23, that is, after the impact of the first cavitation jet flow and before the impact of the second cavitation jet flow onto the substrate, the present embodiment may further comprise the following steps.

Spraying a lifting-off solution to the to-be-lifted-off surface of the substrate.

This may be implemented by using a conventional means. For example, in the case where the first and second cavitation jet flows are respectively formed by a first and a second cavitation jet apparatuses, after a lifting-off process has been performed onto the substrate by using the first cavitation jet flow generated by the first cavitation jet apparatus and before a lifting-off process is performed onto the substrate by using the second cavitation jet flow generated by the second cavitation jet apparatus, that is, when the substrate moves to a position between the nozzles of the first cavitation jet apparatus and the nozzles of the second cavitation jet apparatus, the lifting-off solution is sprayed onto the to-be-lifted-off surface of the substrate.

Due to the impact of the first cavitation jet flow, the film adhered to the photoresist on the to-be-lifted-off surface would rupture or fall off. After the film falls off, the photoresist under the film is exposed, which enlarges the area of the photoresist in contact with the lifting-off solution. Thus, the interaction between the photoresist and the lifting-off solution is increased by spraying the lifting-off solution, whereby the film adhered to the photoresist become more easy to be removed together with the photoresist, and the lifting-off effect is further improved.

Figure 2:
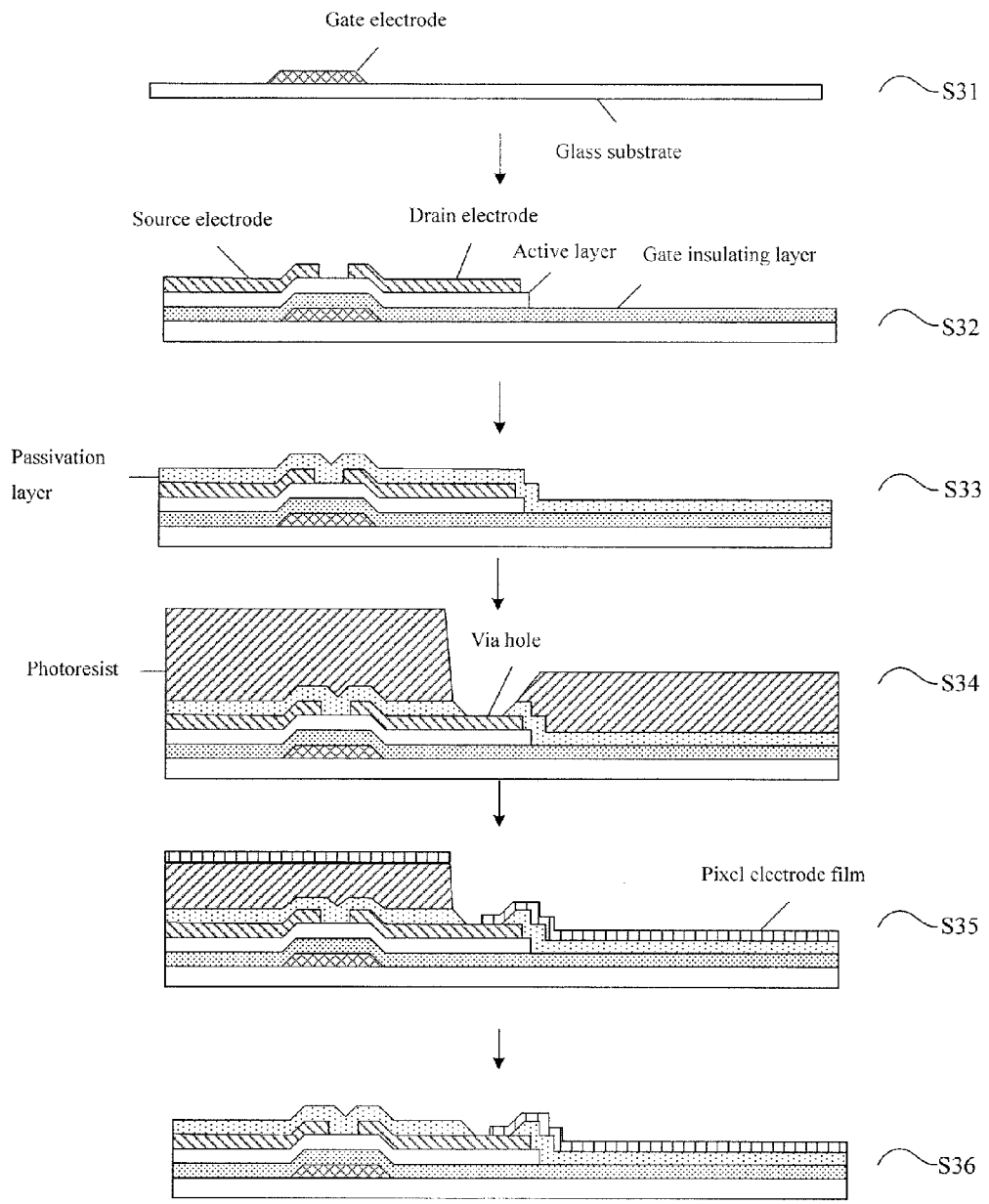
FIG. 2 illustrates a process effect diagram corresponding to the process flow of a manufacturing method for a TFT array substrate according to an embodiment of the disclosure.

Correspondingly, an embodiment of the disclosure provides a manufacturing method for a TFT array substrate in connection with FIG. 2, which comprises the following steps.

Step S31, depositing a first metal film on a glass substrate and forming a pattern including a gate line and a gate electrode through a patterning process on the first metal film.

For example, a layer of metal film is formed, for example, on a glass substrate in a thickness between 1000 Å and 7000 Å by a deposition method such as a magnetron sputtering method. The metal film is typically made of any selected from a group consisting of molybdenum, aluminum, aluminum nickel alloy, molybdenum tungsten alloy, chromium and copper and so on. The combinations of films of any of the above materials may also be used. Then a pattern including a gate line and a gate electrode may be formed on a specified area of the glass substrate by a patterning process, where the patterning process includes exposing, developing, etching, removing of photoresist, and so on.

Step S32, sequentially depositing a gate insulating layer, an active layer film and a source/drain metal film, and forming a pattern including a data line, a source electrode, a drain electrode and a TFT channel region.

For example, the gate insulating layer in a thickness between 1000 Å and 6000 Å and an amorphous silicon film in a thickness between 1000 Å and 6000 Å are successively formed in this step on the glass substrate by a chemical vapor deposition (CVD) method. The material of the gate insulating layer is typically silicon nitride, and silicon oxide or silicon oxynitride may also be used. The amorphous silicon film is dry-etched after an exposure and development on the amorphous silicon film is performed with a mask plate for the active layer to form the active layer. Next, similar to the formation of the gate line, a pattern including a data line, a source electrode, a drain electrode and a TFT channel region is formed by a patterning process.

Step S33, depositing a passivation layer.

For example, a passivation layer having a thickness between 1000 Å and 6000 Å is deposited on the array substrate. The material for the passivation layer typically may be silicon nitride or a transparent organic resin.

Step S34, coating a layer of photoresist on the passivation layer, and forming a via hole through the passivation layer by a patterning process.

After the via hole is formed, the photoresist on a pixel electrode area of the glass substrate is completely removed, while photoresist is remained on the area of the substrate other than the pixel electrode area and the via hole area.

For example, the glass substrate coated with photoresist is exposed and developed by using a double-tone mask, so as to form a region with the photoresist completely removed and corresponding to a region of the via hole through the passivation layer, a region with the photoresist completely remained and corresponding to a region of the pixel electrode, and a region with the photoresist partially remained and corresponding to other areas of the substrate.

The via hole through the passivation layer is formed by etching the passivation layer corresponding to the region with the photoresist completely removed.

By performing an ashing process, the photoresist in the region with the photoresist partially remained is removed, and the thickness of the photoresist at the region with the photoresist completely remained is decreased.

Step S35, depositing a pixel electrode film.

For example, a layer of pixel electrode film is deposited on the whole passivation layer over the glass substrate, similar to the formation of the gate insulating layer. The pixel electrode film typically is an ITO transparent conductive film.

It is to be noted that, the above steps S31 to S34 each may be accomplished by conventional technologies.

Step S36, removing the remained photoresist and the pixel electrode film deposited thereon by using a lifting-off process.

For example, the step comprises: forming a cavitation jet flow by using a lifting-off solution; and impacting the to-be-lifted-off surface of the substrate with the pixel electrode film deposited thereon by using the cavitation jet flow so as to remove the photoresist and the pixel electrode film deposited thereon over the to-be-lifted-off surface.

The lifting-off method used in this step is consistent with the lifting-off method in an embodiment of the disclosure, which is described in detail above. The details are explained in the description hereinbefore and thus are omitted here.

The other processes for manufacturing a TFT array substrate may be continued after step S36, which are in consistent with the conventional processes and thus are omitted here.

According to the manufacturing method for a TFT array substrate according to the embodiment of the disclosure, in the step of performing a lifting-off process, the lifting-off solution is added to the cavitation jet flow. Through the chemical capacity of the lifting-off solution for resolving photoresist and the huge energy released when the bubbles generated in the cavitation jet flow collapse or break at the moment of impacting onto the to-be-lifted-off surface, the photoresist and the film deposited thereon can be quickly removed. Accordingly, the process time can be effectively shortened. In addition, as the impact energy of the cavitation jet flow is concentrated and uniform and the concentration of the lifting-off solution is constant, a uniform lifting-off can be ensured and the lifting-off effect is improved.

It should be appreciated that the embodiments described above are intended to illustrate but not limit the present disclosure. Although the present disclosure has been described in detail herein with reference to the embodiments, it should be understood by those skilled in the art that the present disclosure can be realized with different material and equipment as necessary, and that various modification and equivalents thereof can be made herein without departing from the spirit and scope of the present disclosure.

What is claimed is:

1. A lifting-off method comprising:
   forming a cavitation jet flow by mixing an lifting-off solution and an air flow; and
   impacting a to-be-lifted-off surface of a substrate by means of the cavitation jet flow to remove photoresist and a film deposited on the photoresist over the to-be-lifted-off surface.

2. The method of claim 1, wherein when the lifting-off method is performed onto the same substrate, a flow rate ratio between the lifting-off solution and the air flow is increased over time.

3. The method of claim 2, wherein the flow rate ratio between the lifting-off solution and the air flow is increased by keeping the flow rate of the lifting-off solution constant and decreasing the flow rate of the air flow.

4. The method of claim 3, wherein performing the lifting-off onto the substrate by using cavitation jet flows generated by a same cavitation jet apparatus, wherein the flow rate of the lifting-off solution is kept constant and the flow rate of the air follow is decreased gradually.

5. The method of claim 4, wherein performing the lifting-off onto the substrate by using cavitation jet flows generated by a first and a second cavitation jet apparatuses, wherein the substrate passes nozzles of the first and second cavitation apparatuses at a uniform speed.

6. The method of claim 5, wherein the flow rates of the lifting-off solution of the first and the second cavitation jet apparatuses are substantially the same, and the flow rate of the air flow of the first cavitation jet apparatus is larger than that of the second cavitation jet apparatus.

7. The method of claim 6, wherein after the lifting-off process has been performed onto the substrate by using the first cavitation jet flow generated by the first cavitation jet apparatus and before the lifting-off process is performed onto the substrate using the second cavitation jet flow generated by the second cavitation jet apparatus, the method further comprises spraying the lifting-off solution onto the to-be-lifted-off surface of the substrate.

8. The method of claim 5, wherein after the lifting-off process has been performed onto the substrate by using the first cavitation jet flow generated by the first cavitation jet apparatus and before the lifting-off process is performed onto the substrate using the second cavitation jet flow generated by the second cavitation jet apparatus, the method further comprises spraying the lifting-off solution onto the to-be-lifted-off surface of the substrate.

9. The method of claim 1, wherein when the to-be-lifted-off surface of the substrate is impacted by using the cavitation jet flow, an impact direction of the cavitation jet flow is perpendicular to the to-be-lifted-off surface or deflects a certain angle from the perpendicular direction.

10. The method of claim 1, wherein when the to-be-lifted-off surface of the substrate is impacted by using the cavitation jet flow, a shield is disposed over the substrate, wherein the shield exposes a portion of the to-be-lifted-off surface of the substrate where the photoresist and the film deposited thereon are remained, and wherein other portions of the substrate are covered by the shield so that the film on the other portions of the to-be-lifted-off surface of the substrate are protected from damage.

11. A manufacturing method for a thin film transistor (TFT) array substrate, comprising:

depositing a first metal film on a base substrate, and forming a pattern including a gate line and a gate electrode;

sequentially depositing a gate insulating layer, an active layer film and a source/drain metal film, and forming a pattern including a data line, a source electrode, a drain electrode and a TFT channel region;

depositing a passivation layer;

coating a layer of photoresist on the passivation layer, and forming a via hole through the passivation layer by a patterning process, after which the photoresist on a pixel electrode area of the base substrate is completely removed, and the photoresist on an area of the base substrate other than the pixel electrode area and the via hole area is remained;

depositing a pixel electrode film; and removing remained photoresist and the pixel electrode film deposited on the remained photoresist by using a lifting-off method, wherein removing of remained photoresist and the pixel electrode film deposited on the remained photoresist by using a lifting-off method is preformed by using the lifting-off method of claim 1.

\* \* \* \* \*